United States Patent [19]

Hsue et al.

[11] Patent Number: 5,541,876

[45] Date of Patent: Jul. 30, 1996

[54] MEMORY CELL FABRICATED BY FLOATING GATE STRUCTURE

[75] Inventors: Chen-Chin Hsue; Ming-Tzong Yang, both of Hsin-Chu; Chung-Cheng Wu, Fuh Shing Lii, all of Taiwan

[73] Assignee: United Microelectronics Corporation, Hsin-Chu, Taiwan

[21] Appl. No.: 251,972

[22] Filed: Jun. 1, 1994

[51] Int. Cl.$^6$ ............................... G11C 11/34
[52] U.S. Cl. ........................ 365/178; 365/104; 365/94; 365/185.01; 257/314
[58] Field of Search ........................... 365/178, 185, 365/900, 104, 94; 437/52, 48, 29; 257/314, 315, 316

[56] References Cited

U.S. PATENT DOCUMENTS

| | | | |
|---|---|---|---|
| 3,660,819 | 5/1972 | Frohman-Bentchkowsky | 365/185 |
| 4,099,196 | 7/1978 | Simko | 365/185 |
| 4,114,255 | 9/1978 | Salsbury et al. | 437/43 |
| 4,142,926 | 3/1979 | Morgan | 437/49 |
| 4,203,138 | 5/1980 | Elenbaas | 360/37.1 |
| 4,266,283 | 5/1981 | Perlegos et al. | 365/185 |
| 4,317,272 | 3/1982 | Kuo et al. | 437/43 |
| 4,328,565 | 5/1982 | Harari | 365/185 |
| 4,412,310 | 10/1983 | Korsh et al. | 365/185 |
| 4,432,075 | 2/1984 | Eitan | 365/185 |
| 4,797,856 | 1/1989 | Lee et al. | 365/185 |
| 4,868,619 | 9/1989 | Mukherjee et al. | 257/300 |
| 4,868,629 | 9/1989 | Eitan | 257/316 |
| 5,115,288 | 5/1992 | Manley | 257/316 |
| 5,220,528 | 6/1993 | Mielke | 365/185 |
| 5,289,026 | 2/1994 | Ong | 257/316 |
| 5,349,553 | 9/1994 | Yamada et al. | 365/185 |

Primary Examiner—David C. Nelms
Assistant Examiner—Huan Hoang
Attorney, Agent, or Firm—Meltzer, Lippe, Goldstein et al.

[57] ABSTRACT

A memory cell and a process for making it are disclosed. The ROM code is not implanted in the floating gate for cells selected to be "off". This memory cell has a much lower threshold voltage than conventional cells and the implantation induced crystal damage is avoided.

8 Claims, 3 Drawing Sheets

MEMORY CELL FABRICATED BY FLOATING GATE STRUCTURE

FIELD OF THE INVENTION

This invention relates to a method for implanting the ROM code in a memory device. Specifically, the code is obtained through the implantation of the floating gate.

1. Related Application

Four patent applications, respectively entitled, "Buried Bit Line ROM with Low Bit Line Resistance" bearing Ser. No. 08/092,189 was filed on Jul. 14, 1993, "Self-Aligned Buried N⁺ Bit Line Mask ROM Process" bearing Ser. No. 08/242,787 was filed on May 16, 1994, "A Mask ROM Process" bearing Ser. No. 08/251,979 was filed on Jun. 1, 1994, and "Polysilicon Programming Memory Cell" bearing Ser. No. 08/245,504 filed on May 18, 1994, are assigned to the assignee hereof. These applications contain subject matter related to the subject matter of the present application and are hereby incorporated by reference.

2. Background of the Invention

A ROM (Read Only Memory) is an array of ROM cells. A top view of a conventional array of ROM cells is shown in FIG. 1 and a cross section of an individual cell is shown in FIG. 2. A ROM array has some cells which are conductive and some cells which are not conductive. A ROM mask process allows selective implantation of the ROM code, so that some cells are conductive and some are not. The purpose of a mask ROM process is to enable some cells to be conductive and others to not be conductive. This conductivity selection is accomplished by selective implantation of ions, such as boron, into the channels of selected ROM cells.

Referring to FIGS. 1 and 2, the ROM array 10 is formed on a substrate 11 having a first dopant type. Illustratively, the substrate is P-type silicon with a doping concentration of $5 \times 10^{16} \text{cm}^{-3}$. A plurality of parallel N⁺ type buried bit lines 12 are formed in the substrate 11. A plurality of polysilicon word lines 14 are formed orthogonal to the bit lines on the surface of the substrate 11. The ROM comprises a plurality of cells. One such cell 13 is delineated in FIG. 1 and shown in a cross-sectional view taken along line AA' in FIG. 2.

As shown in FIG. 2, the cell 13 comprises two parallel buried bit lines 12 which form source and drain regions for the cell. A channel 20 of length S is formed between the two bit lines in the cell 13. A gate oxide layer 21 is formed on top of the substrate 11. The oxide layer is thick at portions 22 which are located above the bit lines 12 and thin at portion 23 located over the channel 20. The thick portions 22 are approximately 800 Angstroms and the thin portions 23 are approximately 150 Angstroms. A polysilicon word line 14 is formed over the gate oxide layer 21. A photo resist layer 25 is formed and patterned on the polysilicon layer as a mask. Boron is implanted in cells for which the photoresist layer is removed and not implanted in cells which remain covered by the photo-resist. The implanted boron ions turn off the conducting state for the "off" cell (this programs the cell).

These conventional memory cells are programmed by the implantation of a ROM code via ROM code masking process. This type of programming is problematic for a number of reasons including 1) the alignment of the implanted code is difficult, 2) the voltage level of the junction breakdown is limited and 3) the resulting cells are unsuitable for high voltage operation.

Furthermore, in the deep sub-micron sized device, the ROM code implantation dose of conventional ROM cells has to be increased to increase the threshold voltage.

It is an object of the present invention to provide a method for fabricating a memory cell without these problems.

SUMMARY OF THE INVENTION

This objective is obtained by providing implantation of the floating gate, to obtain the ROM code. When the floating gate of the cell is not implanted as in conventional cells, the threshold voltage of the cell is much higher than that of a cell with an implanted floating gate, in accordance with the present invention. Therefore, in the inventive process, the implantation induced crystal damage can be avoided.

In one embodiment of the invention, a memory cell is provided which comprises: First and second parallel buried bit lines of a second dopant type are formed in a substrate of a first dopant type thereby defining a channel region in the substrate separating the buried bit lines. A gate oxide layer is located on the substrate over the channel. A floating gate is deposited over the gate oxide layer. An insulating layer is formed over the floating gate. A control gate is formed over the insulating layer. ROM code is implanted in said floating gate.

In another embodiment of the present invention, a process for making a memory cell is provided. This process comprises the following steps: Forming a gate oxide layer on a substrate having a first dopant type. Depositing a floating on the gate oxide. Forming first and second parallel buried bit lines having a second dopant type in the substrate on either side of the floating gate. Forming an insulating layer over the floating gate. Depositing a control gate on the insulating layer. Implanting a ROM code in said floating gate.

In yet another embodiment of the present invention, a process for making a ROM cell in a substrate having a gate oxide formed over the substrate, a floating gate formed over the gate oxide, an insulating layer formed over the floating gate, a control gate formed over the insulating layer and parallel buried bit lines formed on each side of the floating gate in the substrate, which comprises implanting ROM code in the floating gate is disclosed.

In still another embodiment of the present invention an array of memory cells is provided. A plurality of parallel buried bit lines of a second dopant type are formed in a substrate having a first dopant type. A plurality of floating gates are disposed between the parallel buried bit lines. A plurality of polysilicon wordlines are formed over the floating gates and orthogonal to the buried bit lines. An insulating layer separating the floating gates from the polysilicon wordlines is deposited. ROM code is implanted in cells selected to be programmed "off".

In another embodiment of the invention a process for making a memory cell is provided in which a gate oxide is grown on a substrate having a first dopant type. Next a floating gate is formed on the gate oxide. An insulating layer is deposited over the floating gate. First and second buried bit lines having a second dopant type are formed in said substrate on either side of the floating gate. A control gate over is formed over the insulating layer. Selection of whether the cell to be programmed on or off is made. If the cell is selected to be off, the floating gate is implanted with ROM code so that the cell is not conductive. And the memory cell is completed using back-end processes.

In yet another embodiment of the invention, a process for programming a memory cell having a floating gate, an insulating layer and a control gate separated from the floating gate by the insulating layer is provided. This process comprises the following steps: Selecting if the cell is to be programmed off or on. If the cell is selected off, implanting the floating gate with a ROM code.

In yet another embodiment of the invention, a ROM cell is provided. The cell comprises a substrate including first and second bit lines spaced apart by a channel. A floating gate is formed over the channel. A control gate is formed over the floating gate. The floating gate is implanted with a ROM code if the cell is programmed to be off.

In a further embodiment of the invention a ROM array is provided. This array comprises a plurality of cells formed in a substrate. Each of these cells includes first and second bit lines separated by a channel. A floating gate is formed over the channel and a control gate is formed over the floating gate. Floating gates of a first plurality of the cells are implanted with a ROM code.

DETAILED DESCRIPTION OF THE INVENTION

Figure 3A:
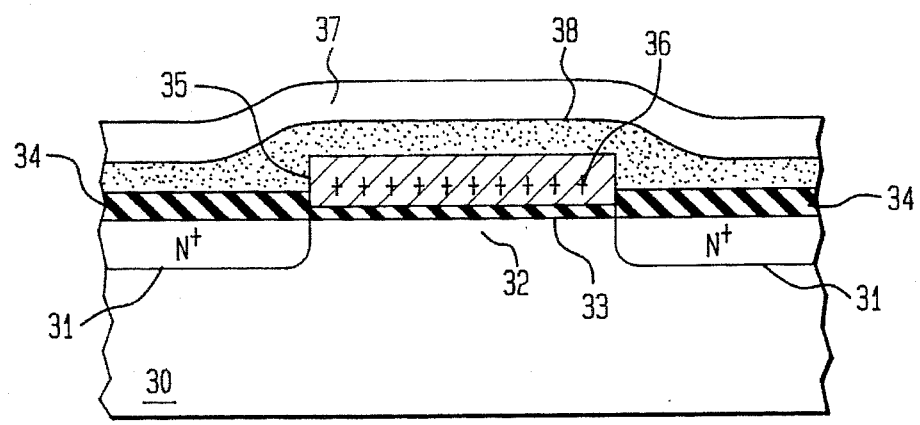
FIG. 3(a) illustrates a memory cell in accordance with the present invention.
Figure 3B:
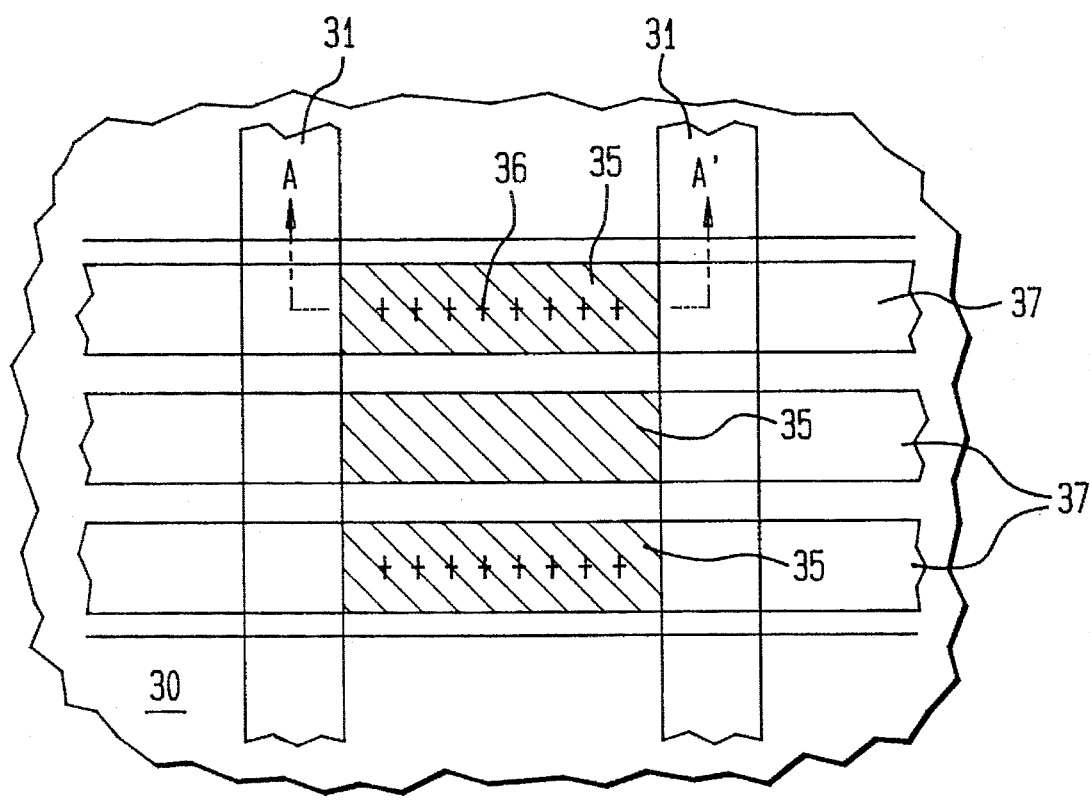
FIG. 3(b) illustrates an array of memory cells in accordance with the present invention.

A memory cell in accordance with the present invention is illustrated in FIG. 3(a) as a cross-section of an array of cells shown in FIG. 3(b) along line A-A'. In a substrate 30 of a first dopant type two parallel buried bit lines 31 having a second dopant type are formed. Illustratively, the substrate is p-type silicon with a doping concentration of approximately $5 \times 10^{16}$ cm$^{-3}$ and the buried bit lines 31 have a dopant type of N$^+$. The buried bit lines form source/drain regions for the cell. A channel 32 separates the buried bit lines 31. A gate oxide 33 is formed over the channel 32 to a thickness of approximately 150 Angstroms. Field oxide regions 34 are formed over the buried bit lines. The field oxide regions 34 are thicker then the gate oxide 33. A floating gate 35 is disposed on the gate oxide 33. The floating gate is preferably made of polysilicon and has a thickness of approximately 3000Å. The floating gate 35 is implanted with a ROM code 36 to place the cell in the off state. The ROM code implantation is illustratively done at an energy of approximately 120 kev of P and a dose unit of approximately $1 \times 10^{16}$ cm$^{-2}$. A control gate or wordline 37 is formed over the floating gate 35. The wordline 37 is also preferably polysilicon having a thickness of approximately 3000Å. An insulating layer 38 separates the floating gate 35 and the control gate 37. The insulating layer is preferably an oxide, such as SiO$_2$, having a thickness of approximately 150Å. The material of the insulating layer may also be used to cover the control gate 37 and the field oxide regions 34.

The threshold voltage of a memory cell is defined by the following formula:

$$V_{TN} = V_{FB} + 2\psi_B + \frac{\sqrt{4\epsilon_s q N_A \psi_B}}{C_i} = \frac{\sqrt{4\epsilon_s q N_A \psi_B}}{C_i}$$

and $$C_i = \frac{\epsilon_i}{d_i}$$

where
- $C_i$ is the capacitance between the control gate and the inversion layer;
- $V_{TN}$ is the threshold voltage;
- $V_{FB}$ is the flat-band voltage;
- $\psi_B$ is the potential difference between the Fermi level $\epsilon_F$ and the intrinsic Fermi level $\epsilon_i$
- $\epsilon_s$ is the dielectric constant for silicon;
- $N_A$ is the level of substrate doping;
- $d_i$ is the thickness of the insulator; and
- $\epsilon_i$ is the dielectric constant for the insulator.

The formulas for the capacitance and threshold voltage can be used to show the difference between a memory cell with the ROM code implanted in the floating gate and a conventional memory cell with the ROM code implanted in the channel.

When the polysilicon floating gate 35 is implanted (N$^+$), it is a conductor and its capacitance is given by $$C_i = \frac{\epsilon_i}{d_i} = \frac{\epsilon_{ox}}{T_{ox1} + T_{ox2}}$$

where $\epsilon_{ox}$ is the dielectric constant for the oxide; $T_{ox1}$ is the thickness of the oxide 33 between the substrate 30 and the floating gate 35; and $T_{ox2}$ is the thickness of the oxide 38 between the floating gate 35 and the control gate 37. The oxides have the same dielectric.

Figure 1:
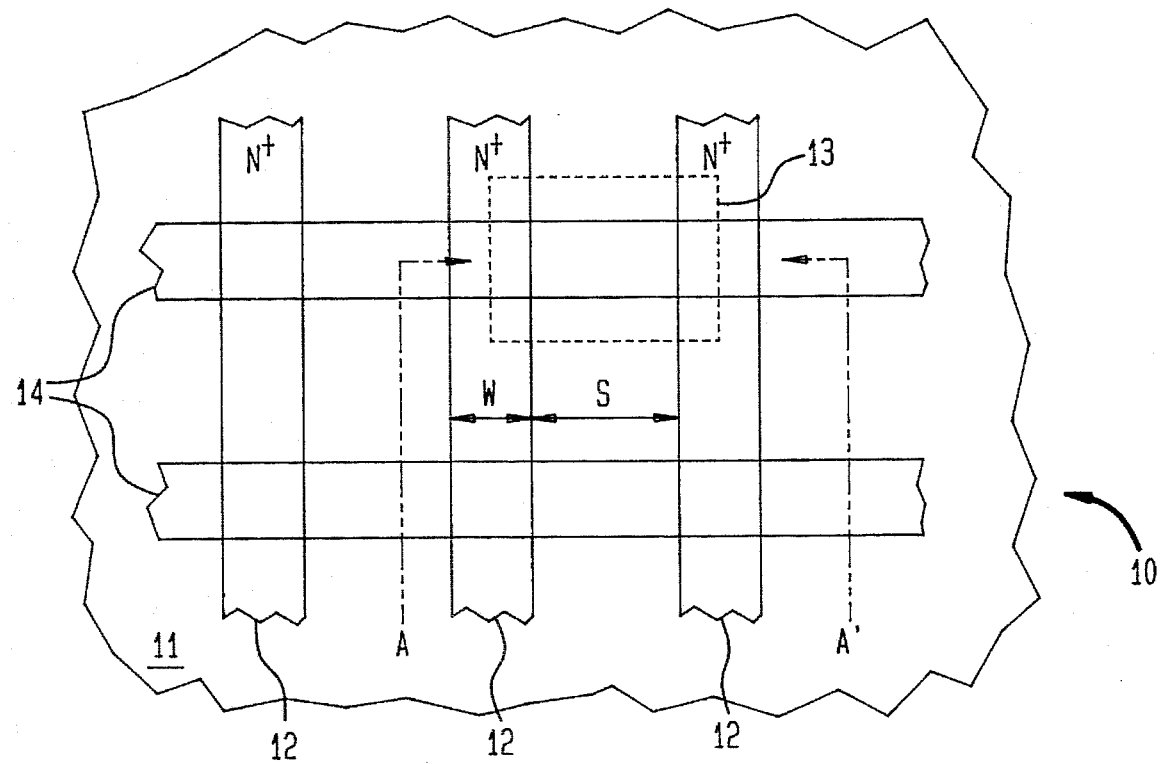
FIG. 1 illustrates a conventional memory cell array.
Figure 2:
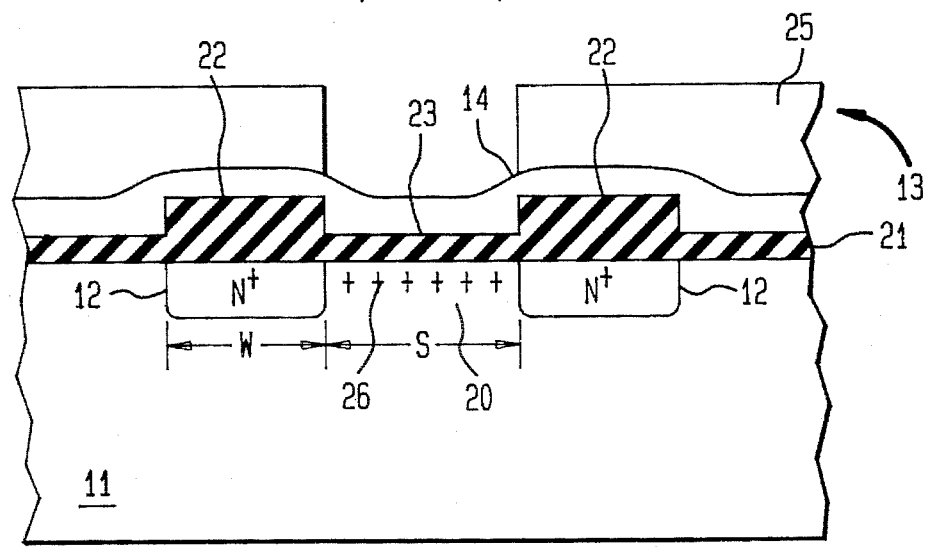
FIG. 2 illustrates a conventional memory cell.

When the floating gate is not implanted, as in the conventional cell, the carrier concentration is very low and can approximately serve as an insulator. With reference to FIG. 2, the capacitance for the conventional cell is given by $$C_i = \frac{\epsilon_i}{d_i} = \frac{\epsilon_{ox}}{T_{ox1} + T_{ox2} + \frac{\epsilon_{ox}}{\epsilon_{si}}(T_{poly1})} \cong \frac{\epsilon_{ox}}{T_{ox1} + T_{ox2} + 1/3(T_{poly1})}$$

where $T_{poly1}$ is the thickness of the floating gate and $\epsilon_i$ is the dielectric constant for silicon.

As an Example, assume $T_{ox1}=T_{ox2}=150$ Å; $T_{poly2}=3000$ Å; $\epsilon_{ox}=3.9$; $\epsilon_{si}=11.9$; and $N_A=4\times10^{16}$ cm$^{-3}$. Then, when the floating gate is implanted the threshold voltage is $V_{TNL} \cong 1.5$V, and when the floating gate is not implanted, the threshold voltage is $V_{TNH} \cong 6.5$ V.

Therefore, $$\frac{V_{TNH}}{V_{TNL}} \cong 4.3$$

As is illustrated, when the floating gate is not implanted adjustment of the threshold voltage is controlled by the thickness of the floating gate. Whereas, when the floating gate is implanted the adjustment of the threshold voltage is controlled by the implantation of the floating gate. The implantation can increase the carrier concentration ($N_A$) in the p-well of the substrate.

Figure 4A:
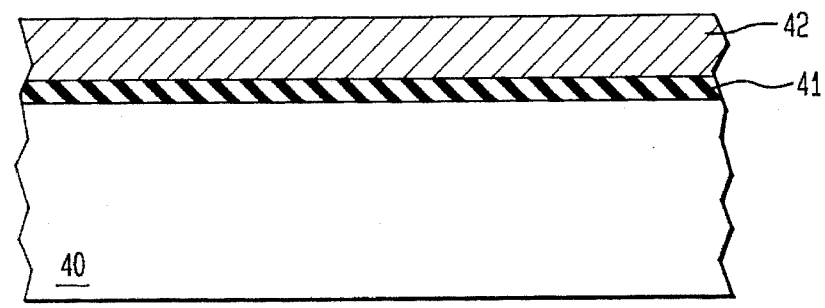
FIGS. 4(a) to 4(d) illustrate a process form making memory cells in accordance with the present invention.

A process for making the memory cell of the present invention is illustrated in FIGS. 4(a) to 4(d). Referring to FIG. 4(a), the process starts with a substrate 40 having a first dopant type. Illustratively, the substrate is p-type silicon with a doping concentration of $5 \times 10^{16}$ cm$^{-3}$. An oxide layer 41 is grown on the substrate 40 to a thickness of approximately 150Å. This oxide layer 41 is the gate oxide and is preferably $S_iO_2$. A polysilicon layer 42 is deposited on the oxide layer 41. The polysilicon layer has a thickness of about 3000Å and is undoped.

Figure 4B:
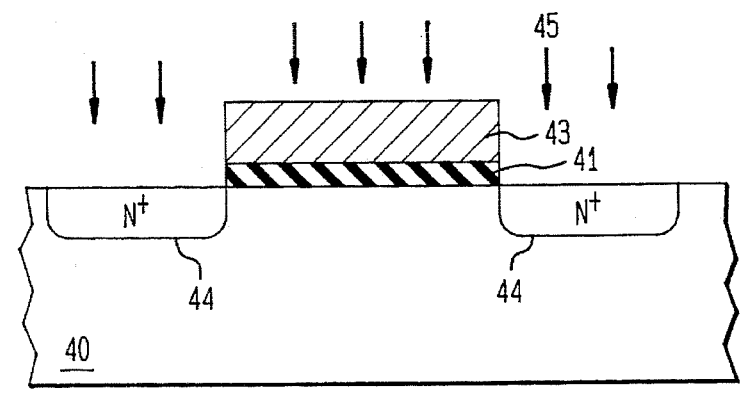

Next, the polysilicon layer 42 is patterned so as to form floating gate 43, as shown in FIG. 4(b). The floating gate is formed by a mask and etch process. First and second buried bit lines 44 having a second dopant type are formed in the substrate 40 on either side of the floating gate. The buried bit lines are formed by ion implantation, as indicated by arrows 45, of As at 80 kev and a dose unit of $5 \times 10^{15}$ cm$^{-2}$.

Figure 4C:
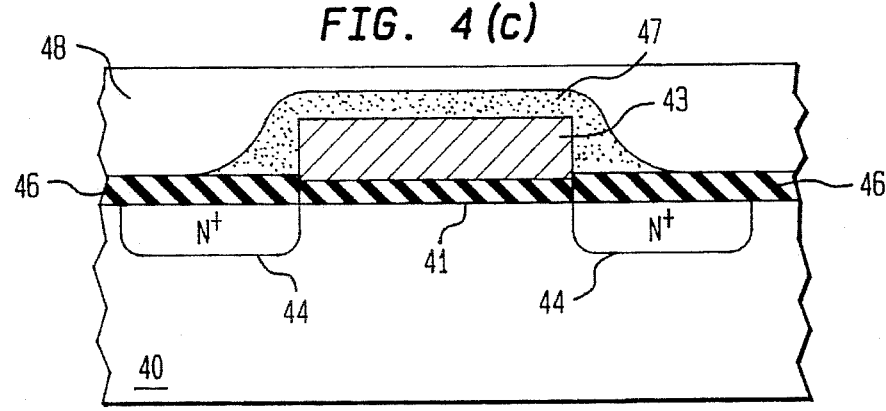

Referring to FIG. 4(c), an oxidation process is performed to form field oxide regions 46 over the buried bit lines 44 which are thicker than the gate oxide 41. Next, an insulating layer 47 is formed on the floating gate 43. The insulating layer is preferably an oxide, such as $S_iO_2$, and has a thickness of approximately 150Å. A second layer of polysilicon 48 is deposited over the insulating layer 47 and the field oxide regions 46. The second polysilicon layer 48 has a doping concentration (N type) of about $1 \times 10^{20}$ cm$^{-3}$ and a thickness of approximately 2000Å.

Figure 4D:
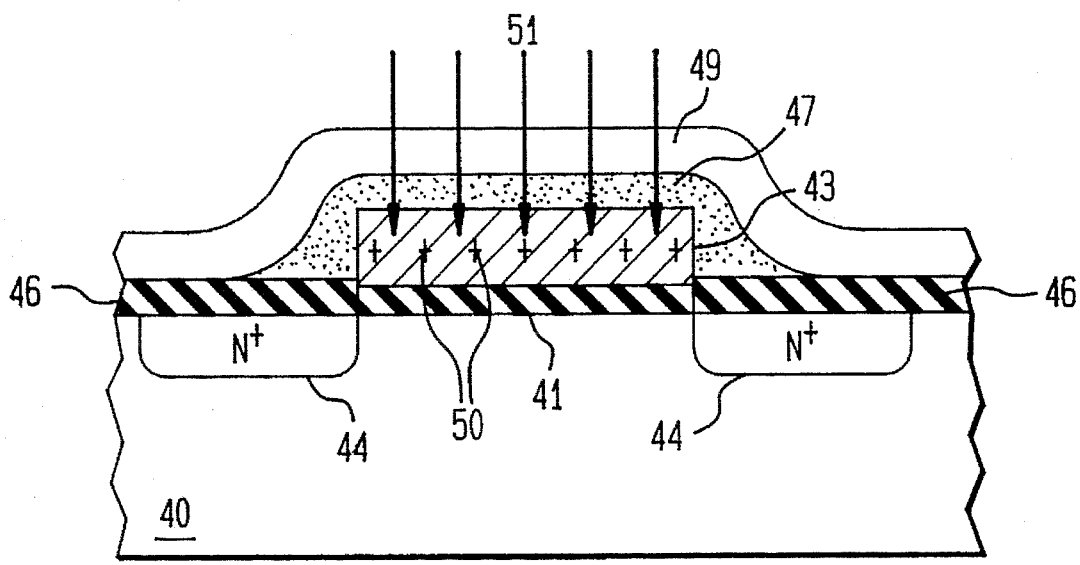

The floating gate 43 is then implanted with ROM code 50. The implantation is indicated at arrows 51. The implantation is performed at 120 kev of P and a dose unit of approximately $1 \times 10^{16}$ cm$^{-2}$. The second polysilicon layer 48 is patterned so as to form control gate or wordline 49, as shown in FIG. 4(d). The control gate is formed by a mask and etch process. The memory cell is completed by conventional back-end processes, such as metallization and passivation.

Finally, the above-described embodiments of the invention are intended to be illustrative only. Numerous alternative embodiments may be devised by those skilled in the art without departing from the spirit and scope of the following claims.

We claim:

1. A memory cell programmed in an "off" state, comprising:

a gate oxide grown on a substrate of a first dopant type, wherein said gate oxide is confined between two bit lines buried in said substrate, said bit lines acting as a source and a drain, respectively, a floating gate disposed on said gate oxide, an insulating layer extending over said floating gate, a control gate extending over a said insulating layer, and ROM code implanted in said floating gate.

2. A memory cell comprising:

first and second parallel buried bit lines of a second dopant type formed in a substrate of a first dopant type, a channel region in said substrate separating the buried bit lines, a gate oxide layer located on the substrate over said channel, wherein said gate oxide layer is confined between said first and second parallel buried bit lines, a floating gate deposited over the gate oxide layer, an insulating layer formed over the floating gate, a control gate formed over said insulating layer, and ROM code implanted in said floating gate.

3. The memory cell of claim 2, wherein said gate oxide layer has a thickness of about 150Å and said insulating layer has a thickness of about 150Å.

4. The memory cell of claim 2, wherein said insulating layer is preferably $S_iO_2$.

5. An array of memory cells, comprising:

a substrate of a first dopant type, a plurality of parallel buried bit lines of a second dopant type formed in said substrate, a plurality of floating gates confined between said parallel buried bit lines, a plurality of polysilicon wordlines formed over said floating gates and orthogonal to said buried bit lines, an insulating layer separating said floating gates from said polysilicon wordlines, and ROM code implanted in cells selected to be programmed "off".

6. A process for programming a memory cell having a source, a drain, a floating gate, an insulating layer and a control gate separated from the floating gate by the insulating layer, comprising:

selecting if said cell is to be programmed off or on, if said cell is selected off,
implanting said floating gate with a ROM code confined between said source and said drain.

7. A ROM cell, comprising:

a substrate including first and second bit lines spaced apart by a channel, a floating gate formed over said channel, wherein said floating gate is confined between the first and second bit lines, a control gate formed over said floating gate, and said floating gate being implanted with a ROM code if said cell is programmed to be off.

8. A ROM array, comprising:

a plurality of cells formed in a substrate, each of said cells including first and second bit lines separated by a channel, a floating gate formed over said channel, axed a control gate formed over said floating gate, wherein said floating gate is confuted between said first and second bit lines, and wherein the floating gates of a first plurality of said cells are implanted with a ROM code.

\* \* \* \* \*